United States Patent
Cheng

(10) Patent No.: US 9,627,448 B2
(45) Date of Patent: Apr. 18, 2017

(54) OLED PANEL

(71) Applicant: Ye Xin Technology Consulting Co., Ltd., Hsinchu (TW)

(72) Inventor: Jung-An Cheng, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/678,155

(22) Filed: Apr. 3, 2015

(65) Prior Publication Data

US 2015/0311268 A1 Oct. 29, 2015

(30) Foreign Application Priority Data

Apr. 23, 2014 (TW) ............................. 103114609 A

(51) Int. Cl.
*H01L 27/32* (2006.01)
*H01L 51/56* (2006.01)

(52) U.S. Cl.
CPC .......... *H01L 27/3216* (2013.01); *H01L 51/56* (2013.01); *H01L 2251/558* (2013.01)

(58) Field of Classification Search
CPC . H01L 51/0005; H01L 51/56; H01L 27/3216; H01L 27/3218; H01L 27/3246
See application file for complete search history.

(56) References Cited

U.S. PATENT DOCUMENTS

| 8,962,073 B2* | 2/2015 | Bulovic | B05B 17/0638 427/197 |
|---|---|---|---|
| 2006/0007054 A1* | 1/2006 | Chang | G02F 1/133524 345/1.3 |
| 2007/0115421 A1* | 5/2007 | Nonaka | G02F 1/133516 349/156 |
| 2008/0018245 A1* | 1/2008 | Kim | H01L 27/3253 313/512 |
| 2009/0212687 A1* | 8/2009 | Cok | H01L 51/5265 313/504 |
| 2011/0300289 A1* | 12/2011 | Suzuki | H01L 51/0005 427/8 |
| 2013/0329152 A1* | 12/2013 | Zhong | G02F 1/133377 349/43 |
| 2014/0063586 A1* | 3/2014 | Jung | G02B 26/005 359/290 |
| 2014/0197385 A1* | 7/2014 | Madigan | H01L 51/56 257/40 |
| 2014/0197396 A1* | 7/2014 | Madigan | H01L 51/0005 257/40 |
| 2014/0361965 A1* | 12/2014 | Cheng | G09G 3/3208 345/83 |

FOREIGN PATENT DOCUMENTS

JP P2011-034649 2/2011
JP P2012-199207 10/2012

* cited by examiner

*Primary Examiner* — Jaehwan Oh
(74) *Attorney, Agent, or Firm* — Steven M. Reiss

(57) ABSTRACT

The present invention provides an OLED panel. The OLED panel includes a substrate and a plurality of walls formed on the substrate. The substrate and the walls define a plurality of containing areas. Each of the containing areas is corresponding to each of a plurality of sub-pixels. The sub-pixels are separated from each other by the walls. Each of the sub-pixels includes one of emitting materials formed in one of the containing areas. At least one of the containing areas corresponding to the sub-pixel includes a first partition. The height of the first partition is lower than the walls.

20 Claims, 20 Drawing Sheets

OLED PANEL

FIELD

The subject matter herein generally relates to an OLED panel with high resolution.

BACKGROUND

Currently, organic light emitting diode (OLED) panels are being introduced into next generation displays. An OLED panel includes a plurality of pixels. FIG. 1 shows each of the pixels in an OLED panel including a red sub-pixel, a green sub-pixel and a blue sub-pixel. Generally, an organic emitting material corresponding to an emitting color is injected into a containing area of the OLED panel. The emitting efficiency of the organic emitting materials corresponding to different emitting colors is different. For the purpose of keeping the same emitting intensity of the red sub-pixel, the green sub-pixel and the blue sub-pixel, the corresponding emitting area of the red sub-pixel, the green sub-pixel and the blue sub-pixel is inversely proportional to the emitting efficiency of the corresponding organic emitting materials. The emitting efficiency of the red emitting material is the highest such that the emitting area of the red sub-pixel is the smallest. The emitting efficiency of the blue emitting material is the lowest such that the emitting area of the blue sub-pixel is the largest.

The emitting area of the sub-pixel becomes smaller when the PPI (pixels per inch) of the OLED panel becomes higher. However, if the emitting area of the sub-pixel is smaller than the diameter of the droplet of the corresponding emitting material, the droplet of the corresponding emitting material cannot totally inject into the containing area corresponding to the sub-pixel. It causes the droplet to be deposited outside the containing area, and the color mixing issue. Therefore, the resolution of the current OLED panel is limited.

BRIEF DESCRIPTION OF THE DRAWINGS

Implementations of the present technology will now be described, by way of example only, with reference to the attached figures.

DETAILED DESCRIPTION

Figure 1:
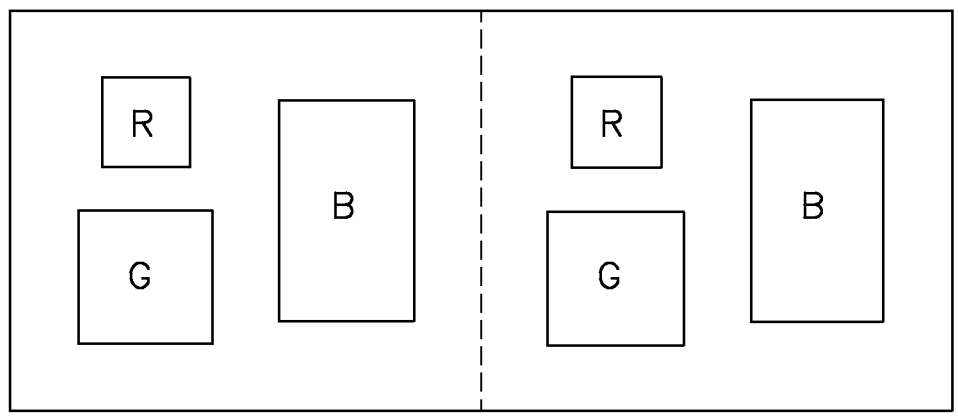
FIG. 1 is a block diagram of a pixel arrangement of a conventional OLED panel.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series and the like.

The present disclosure is described in relation to an OLED panel with high resolution.

Figure 2:
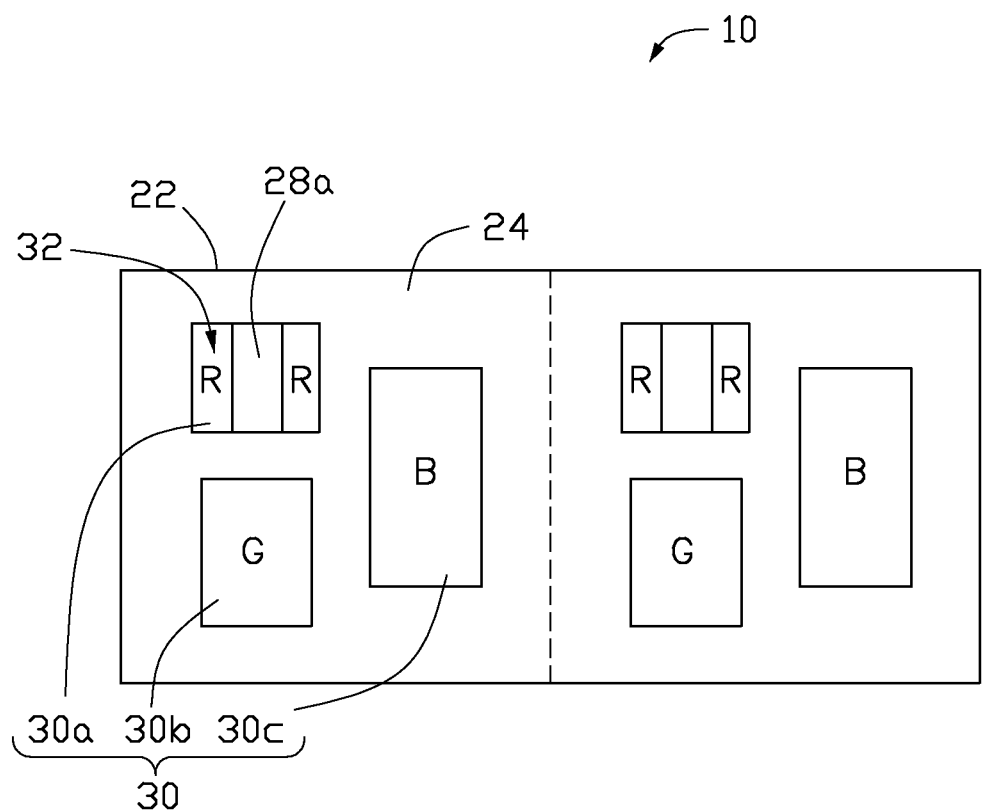
FIG. 2 is a block diagram of a pixel arrangement of a first embodiment of an OLED panel according to the present disclosure.
Figure 3:
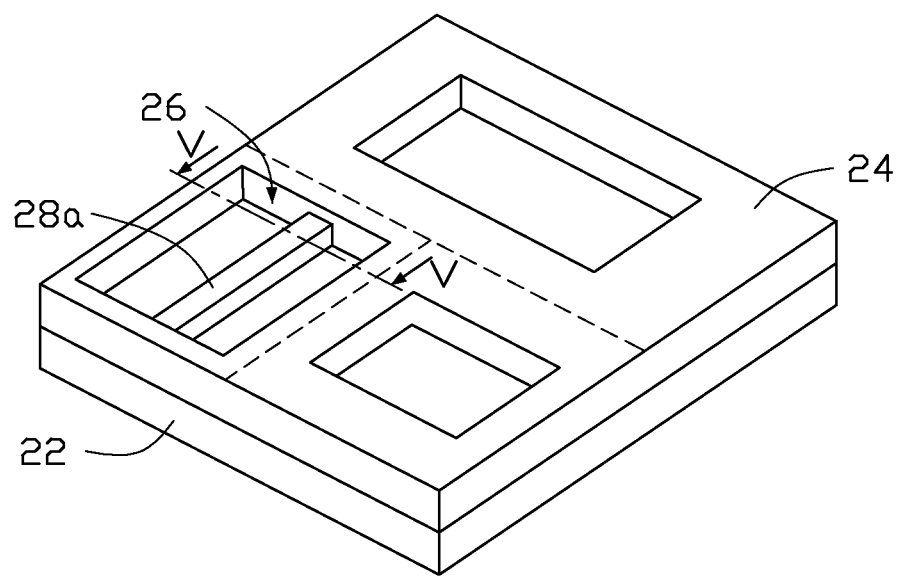
FIG. 3 is an isometric view of a pixel of the OLED panel of FIG. 2.
Figure 4:
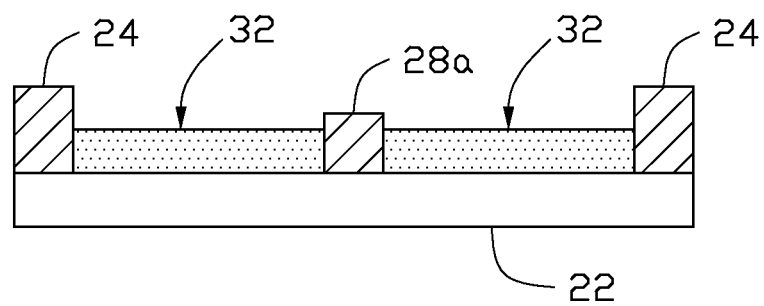
FIG. 4 is a cross-sectional view along a section line V-V of FIG. 3.

FIGS. 2, 3 and 4 illustrate a first embodiment of an OLED panel 10 according to the present disclosure. The OLED panel 10 includes a substrate 22 and a plurality of walls 24 formed on the substrate 22. The substrate 22 and the walls 24 define a plurality of containing areas 26. The OLED panel 10 includes a plurality of sub-pixels separated from each other by the walls 24, and each of the containing areas 26 is corresponding to each of the sub-pixels. A plurality of pixels 30 are defined by the sub-pixels. In the first embodiment, each of the pixels 30 at least includes the first sub-pixel 30a emitting red color, the second sub-pixel 30b emitting green color, and the third sub-pixel 30c emitting blue color. Emitting materials 32 corresponding to each of the sub-pixels are formed in the containing area 26 corresponding to each of the sub-pixels. The OLED panel 10 further includes a plurality of sub-pixel driving circuits for driving emitting materials 32 of each sub-pixel.

The different color emitting materials are injected into a plurality of containing areas 26 corresponding to the first sub-pixel 30a, the second sub-pixel 30b, and the third sub-pixel 30c. In the first embodiment, the first sub-pixel 30a is a red sub-pixel R, the second sub-pixel 30b is a green sub-pixel G, the third sub-pixel 30c is a blue sub-pixel B. The emitting material 32 emitting red color is injected into the first sub-pixel 30a, the emitting material 32 emitting green color is injected into the second sub-pixel 30b, and the emitting material 32 emitting blue color is injected into the third sub-pixel 30c. Since the emitting efficiency of the red sub-pixel R is higher than the green sub-pixel G and the emitting efficiency of the green sub-pixel G is higher than the blue sub-pixel B, the emitting area of the first sub-pixel 30a is smaller than the second sub-pixel 30b and the emitting area of the second sub-pixel 30b is smaller than the third sub-pixel 30c in each pixel 30 to balance the luminance of the red, green, and blue sub-pixels.

The emitting area of the first sub-pixel 30a, the second sub-pixel 30b, and the third sub-pixel 30c of each pixel 30 becomes smaller when the PPI (pixels per inch) of the OLED panel 10 becomes higher. When the PPI is too high, the shortest edge of the first containing area 26 corresponding to the first sub-pixel 30a is smaller than the diameter of the droplet of the emitting material 32 emitting red color. Such that the droplet of the emitting material 32 cannot totally be injected into the first containing area 26 corresponding to the first sub-pixel 30a. It causes the droplet to be deposited outside the first containing area 26, and the color mixing issue of the OLED panel 10.

A first partition 28a is formed in the first containing area 26 and the height of the first partition 28a is lower than the walls 24 of the first containing area 26. In the other words, the height of the first partition 28a is less than a first depth of the first containing areas 26. The shortest edge of the first containing area 26 is enlarged to over the diameter of the first droplet of the emitting material 32. The first containing area 26 corresponding to the first sub-pixel 30a is enlarged such that the droplet of the emitting material 32 is totally injected into the first containing area 26. The material of the first partition 28a may be the same as the walls 24 of the first containing area 26. The first partition 28a and the walls 24 of the first containing area 26 may be formed by the exposure process, the developing process and the etching process at the same time. The gray-tone mask or the halftone mask may be used in the exposure process. The height of the first partition 28a is lower than the walls 24 of the first containing area 26 such that when the droplet of the emitting material 32 is injected into the first containing area 26, the droplet of the emitting material 32 flows into, and is formed in a space defined by the first partition 28a and the walls 24 of the first containing area 26. Such that the area of the first partition 28a balances the enlarged area of the first containing area 26 and the emitting area of the first sub-pixel 30a is kept the same. Furthermore, when the light is emitted from the top of the substrate 22, the height of the emitting material 32 in the first containing area 26 is not over the height of the first partition 28a such that the emitting area of the first sub-pixel 30a is keep the same. When the light is emitted from the bottom of the substrate 22, the height of the emitting material 32 in the first containing area 26 may be over the height of the first partition 28a and the emitting area of the first sub-pixel 30a is still kept the same.

In the other words, each of the first containing areas 26 has a first depth. The height of the first partition 28a is less than the first depth of the first containing areas 26.

Figure 5:
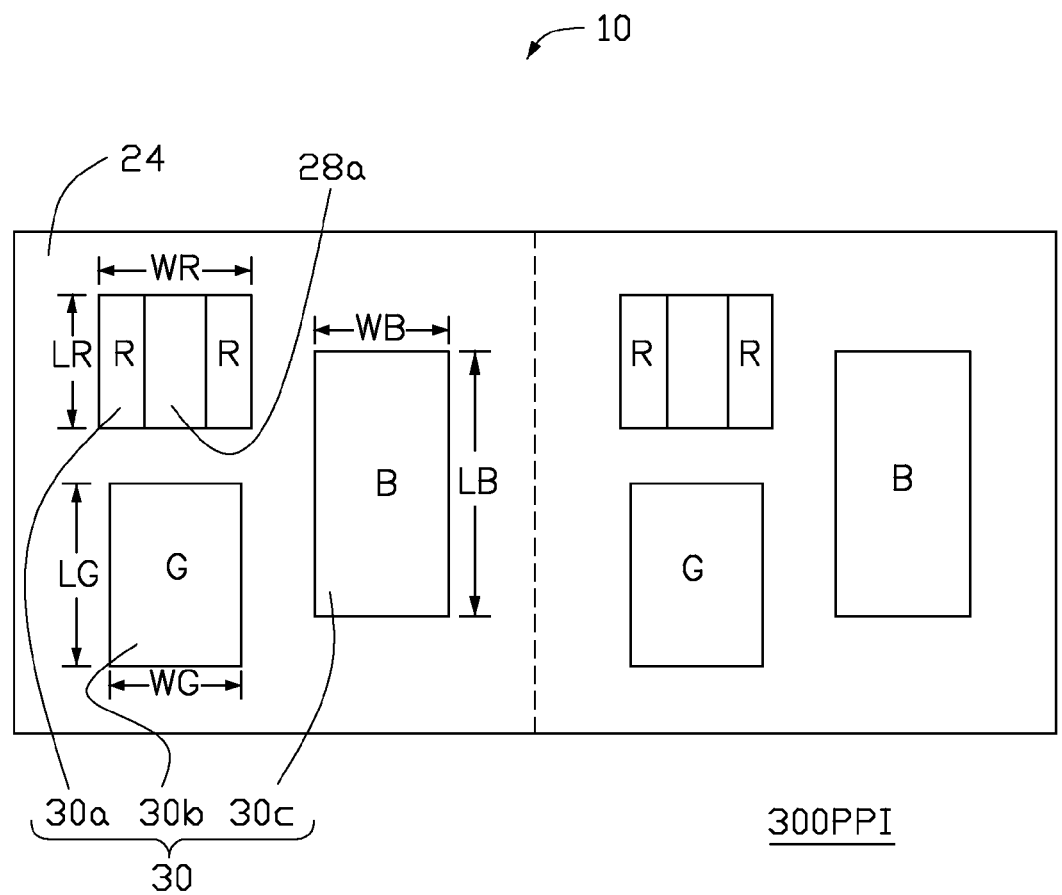
FIG. 5 is a block diagram of a pixel arrangement of a second embodiment of an OLED panel according to the present disclosure.
Figure 6:
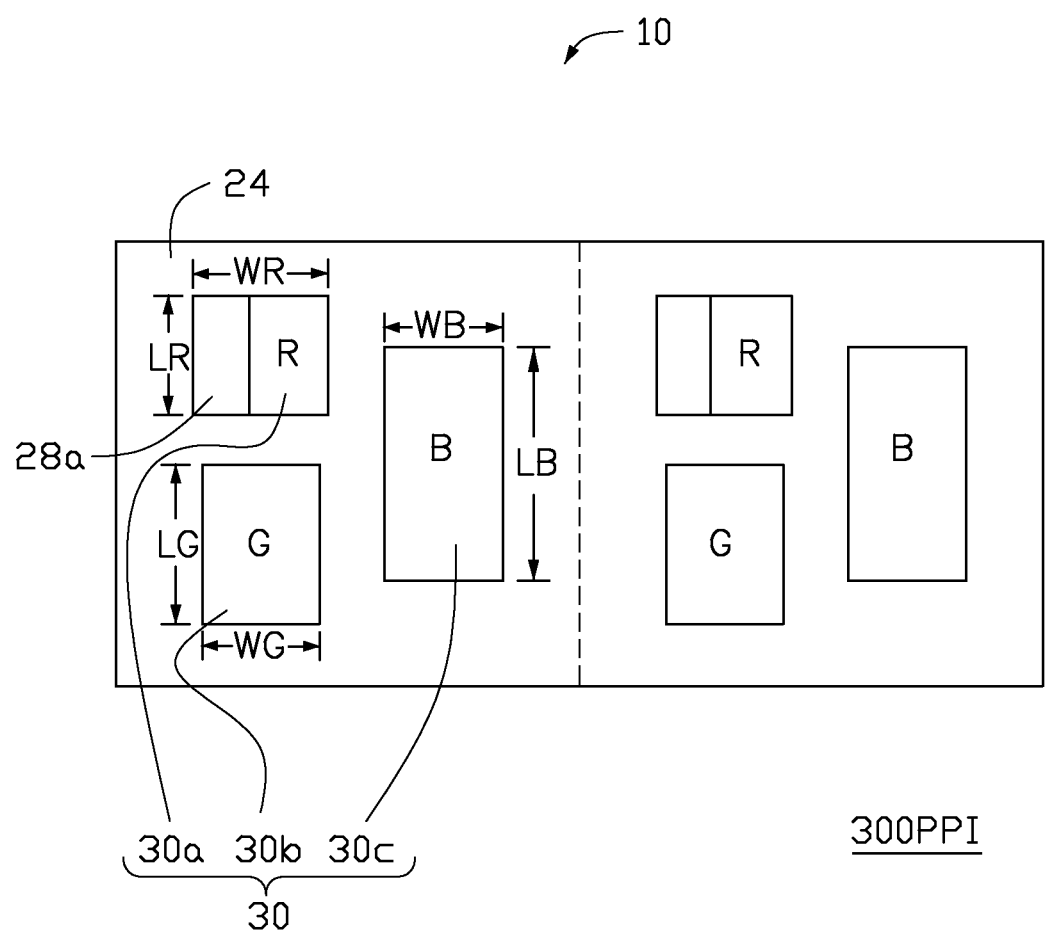
FIG. 6 and FIG. 7 are block diagrams of different positions of the first partition of FIG. 5.
Figure 7:
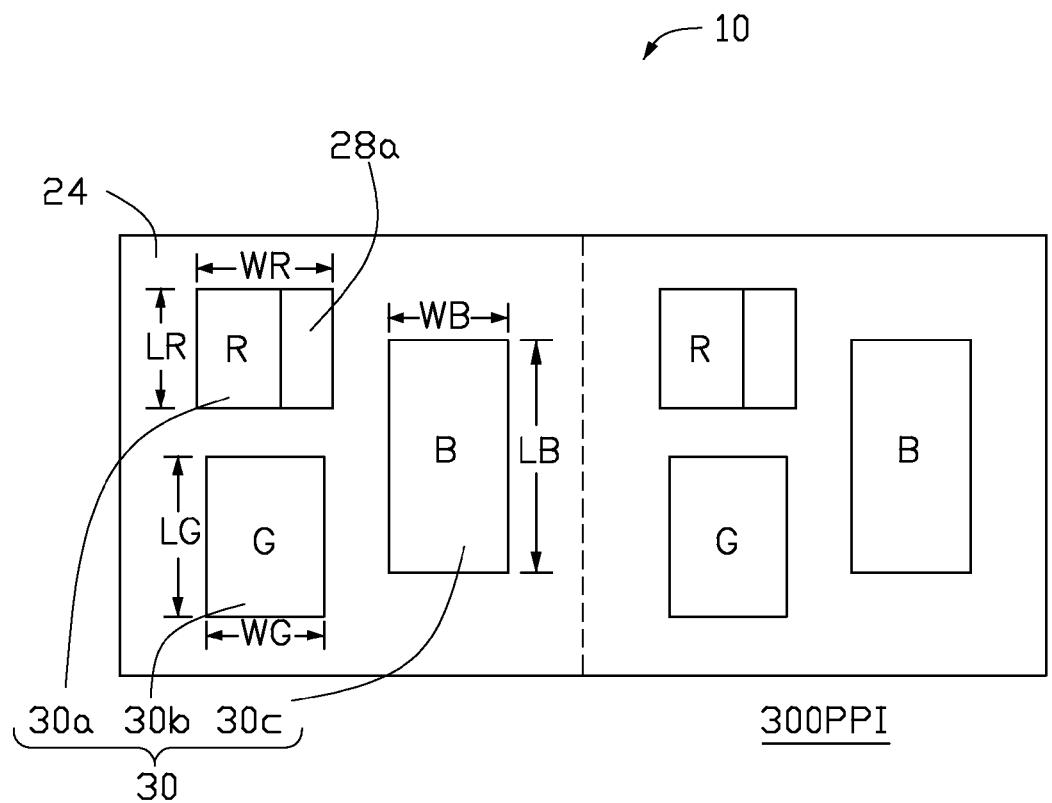

FIG. 5 is a block diagram of a pixel arrangement of a second embodiment of an OLED panel according to the present disclosure. For example, the PPI of the OLED panel 10 in the second embodiment is 300. The emitting area of the first sub-pixel 30a is 322 μm2. The length LR of the first containing area corresponding to the first sub-pixel 30a is 22 μm and the width WR of the first containing area corresponding to the first sub-pixel 30a is 25.1 μm. The length LG of the second containing area corresponding to the second sub-pixel 30b is 29.5 μm and the width WG of the second containing area corresponding to the second sub-pixel 30b is 22 μm. The length LB of the third containing area corresponding to the third sub-pixel 30c is 43.5 μm and the width WB of the third containing area corresponding to the third sub-pixel 30b is 22 μm. In the second embodiment, the first partition 28a is parallel to one of the walls 24 of the first containing area extending in a first direction. The first direction is parallel to the direction of the length LR of the first containing area. Both ends of the first partition 28a contact with one of the walls 24 of the first containing area extending in a second direction different from the first direction. The second direction is parallel to the direction of the width WR of the first containing area. The position of the first partition 28a is located at the center of the first containing area corresponding to the first sub-pixel 30a. The width of the first partition 28a is 10 μm. Therefore, the emitting area of the first sub-pixel 30a is 322 μm2, and the first containing area corresponding to the first sub-pixel 30a is 552 μm2. The first containing area is enlarged by the first partition 28a and the emitting area of the first sub-pixel 30a is kept the same. Such that the droplet is deposited inside the first containing area to avoid the color mixing issue. Furthermore, please refer to FIG. 6 and FIG. 7, the position of the first partition 28a is close to one of the walls 24 extending in the first direction of the first containing area corresponding to the first sub-pixel 30a. The first direction is parallel to the direction of the length LR of the first containing area corresponding to the first sub-pixel 30a.

Figure 8:
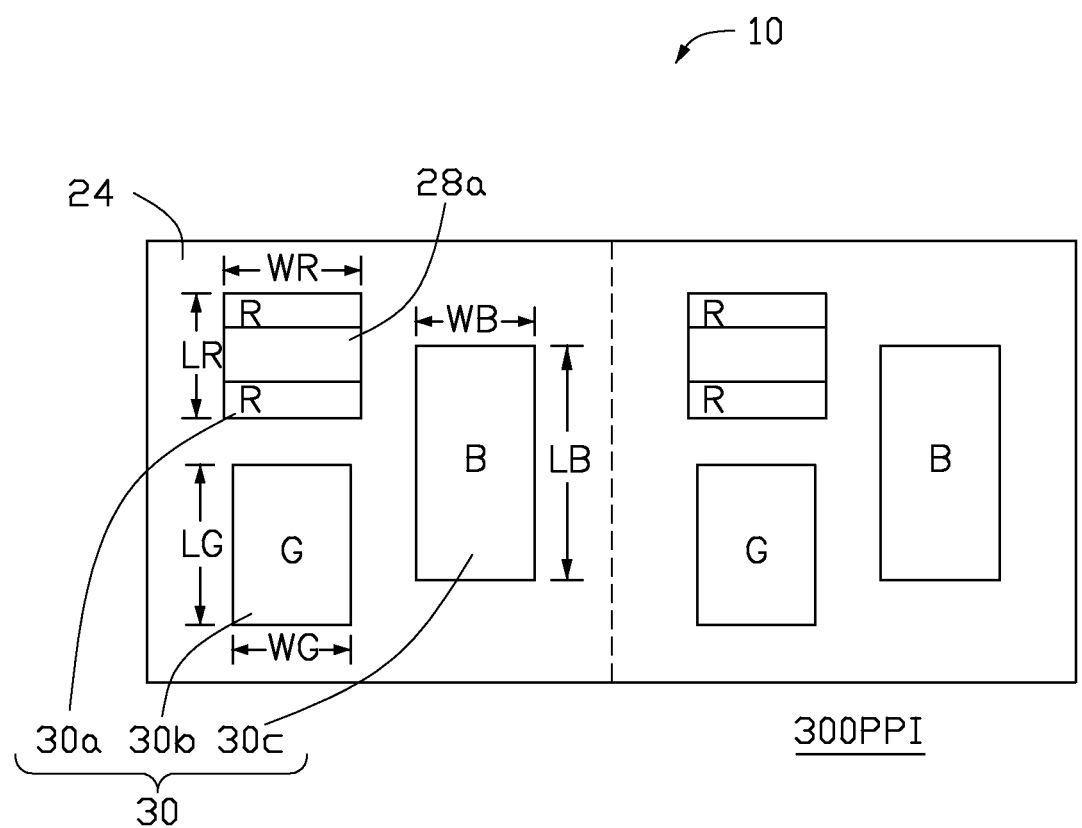
FIG. 8 is a block diagram of a pixel arrangement of a third embodiment of an OLED panel according to the present disclosure.
Figure 9:
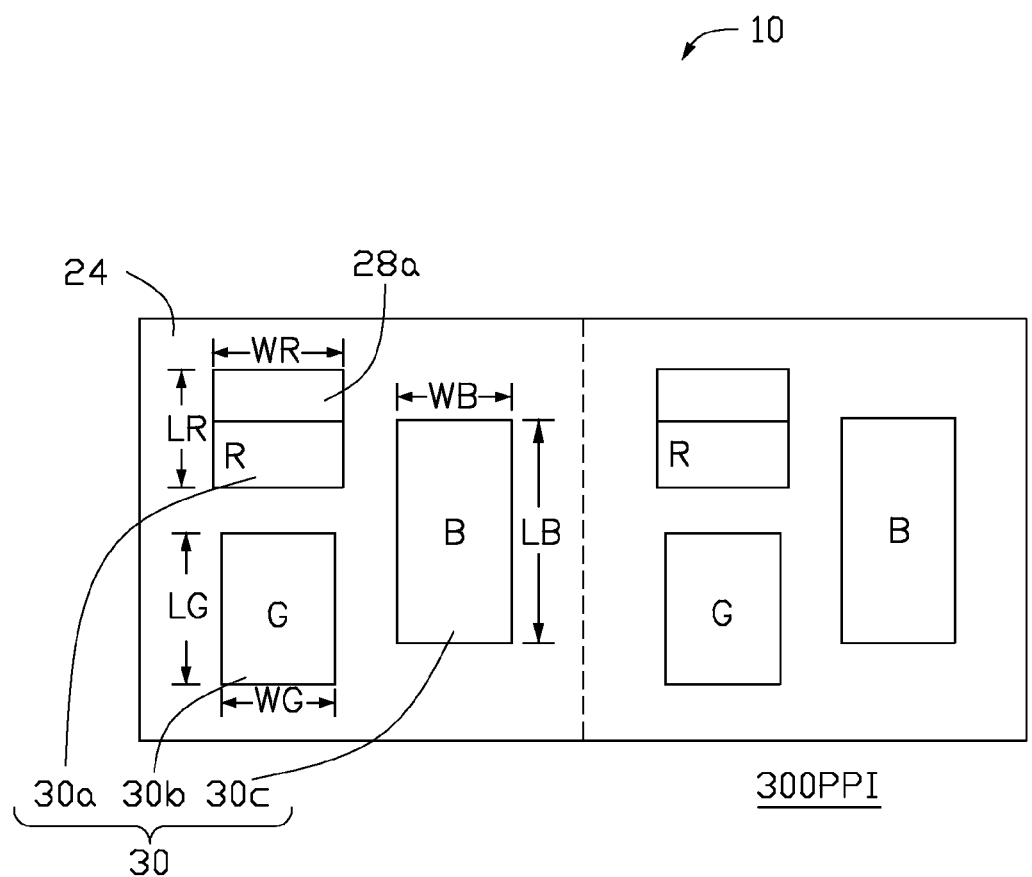
FIG. 9 and FIG. 10 are block diagrams of different positions of the first partition of FIG. 8.
Figure 10:
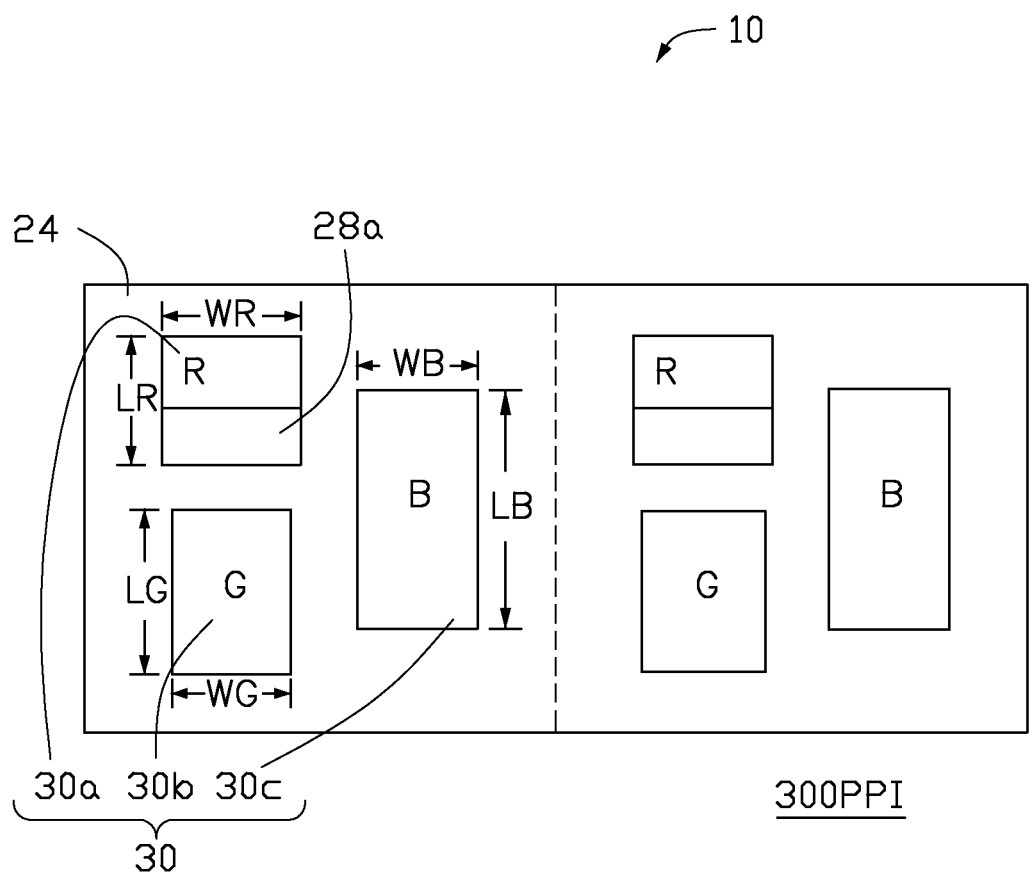

FIG. 8 is a block diagram of a pixel arrangement of a third embodiment of an OLED panel according to the present disclosure. For example, the PPI of the OLED panel 10 in the third embodiment is 300. The length LR of the first containing area corresponding to the first sub-pixel 30a is 23.2 μm and the width WR of the first containing area corresponding to the first sub-pixel 30a is 25.1 μm. The length LG of the second containing area corresponding to the second sub-pixel 30b is 29.5 μm and the width WG of the second containing area corresponding to the second sub-pixel 30b is 22 μm. The length LB of the third containing area corresponding to the third sub-pixel 30c is 43.5 μm and the width WB of the third containing area corresponding to the third sub-pixel 30b is 22 μm. In the third embodiment, the first partition 28a is parallel to one of the walls 24 of the first containing area extending in a second direction. The second direction is parallel to the direction of the width WR of the first containing area. Both ends of the first partition 28a contact with one of the walls 24 of the first containing area extending in a first direction different from the second direction. The first direction is parallel to the direction of the length LR of the first containing area. The position of the first partition 28a is located at the center of the first containing area corresponding to the first sub-pixel 30a. The width of the first partition 28a is 10 μm. Therefore, the emitting area of the first sub-pixel 30a is 322 μm2, and the first containing area corresponding to the first sub-pixel 30a is 582 μm2. Such that the droplet is deposited inside the first containing area to avoid the color mixing issue. Furthermore, please refer to FIG. 9 and FIG. 10, the position of the first partition 28a is close to one of the walls extending in the second direction.

Figure 11:
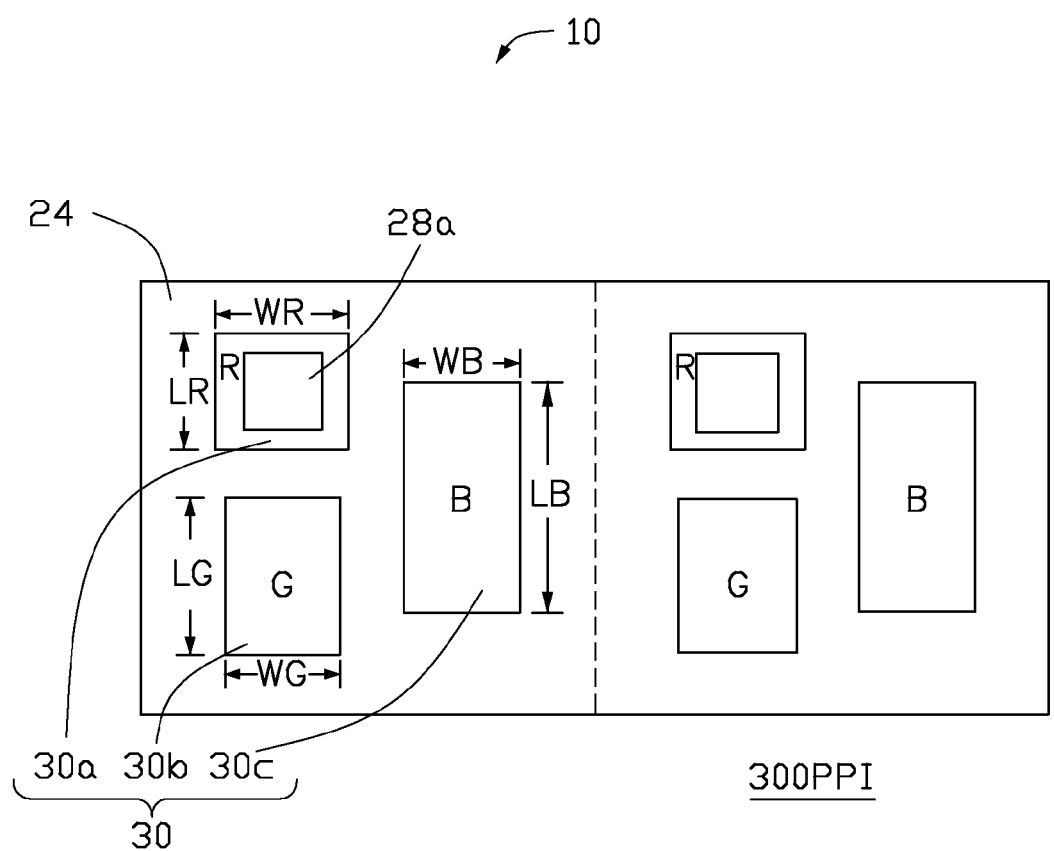
FIG. 11 is a block diagram of a pixel arrangement of a fourth embodiment of an OLED panel according to the present disclosure.

FIG. 11 is a block diagram of a pixel arrangement of a fourth embodiment of an OLED panel according to the present disclosure. For example, the PPI of the OLED panel 10 in the fourth embodiment is 300. The length LR of the first containing area corresponding to the first sub-pixel 30a is 22 μm and the width WR of the first containing area corresponding to the first sub-pixel 30a is 25 μm. The length LG of the second containing area corresponding to the second sub-pixel 30b is 29.5 μm and the width WG of the second containing area corresponding to the second sub-pixel 30b is 22 µm. The length LB of the third containing area corresponding to the third sub-pixel 30c is 43.5 µm and the width WB of the third containing area corresponding to the third sub-pixel 30b is 22 µm. In the fourth embodiment, the shape of the first partition 28a is square, and the position of the first partition 28a is located at the center of the first containing area. Both the length and the width of the first partition 28a are 14.8 µm. Therefore, the emitting area of the first sub-pixel 30a is 322 µm2, and the first containing area corresponding to the first sub-pixel 30a is 550 µm2. Such that the droplet is deposited inside the first containing area to avoid the color mixing issue.

Figure 12:
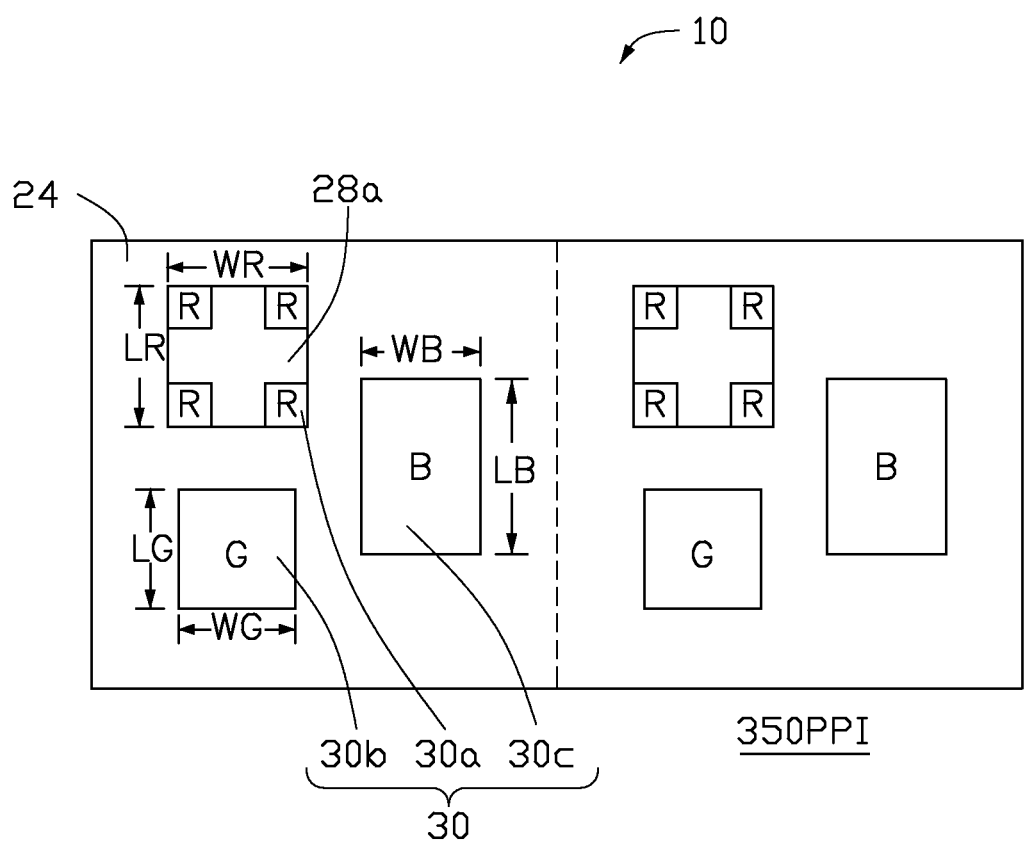
FIG. 12 is a block diagram of a pixel arrangement of a fifth embodiment of an OLED panel according to the present disclosure.
Figure 13:
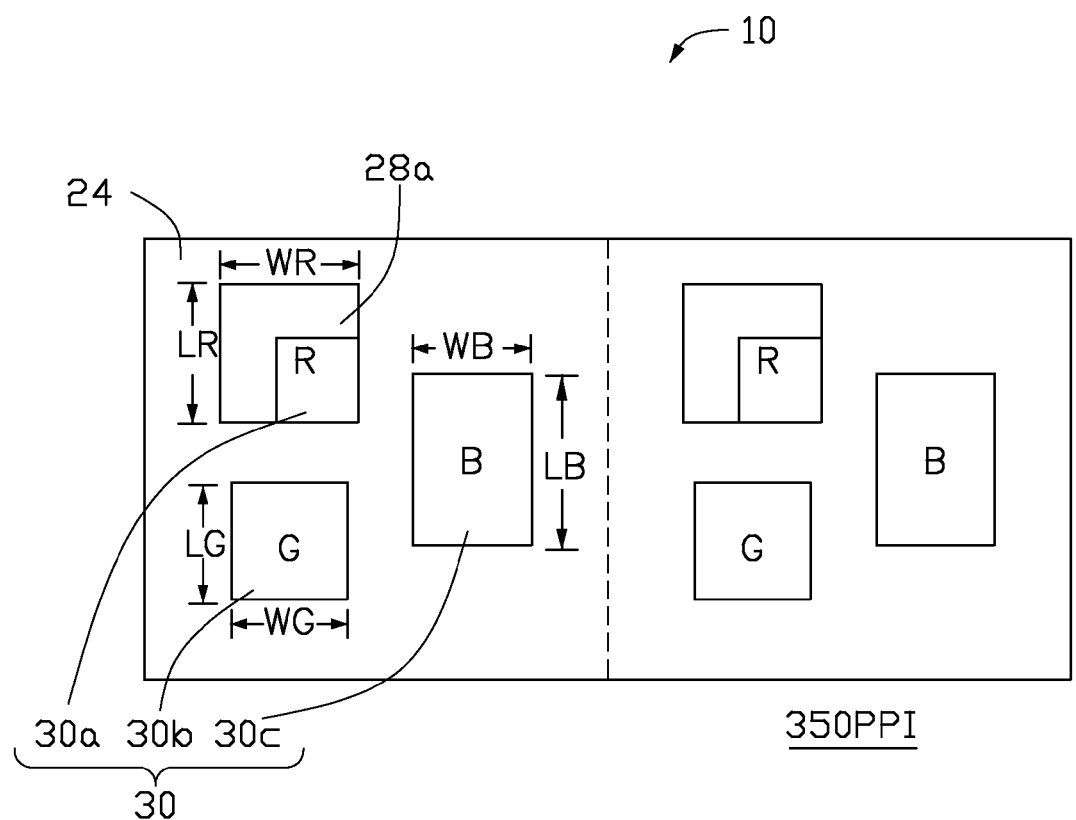
FIGS. 13, 14, 15, 16 and 17 are block diagrams of different positions of the first partition of FIG. 12.
Figure 14:
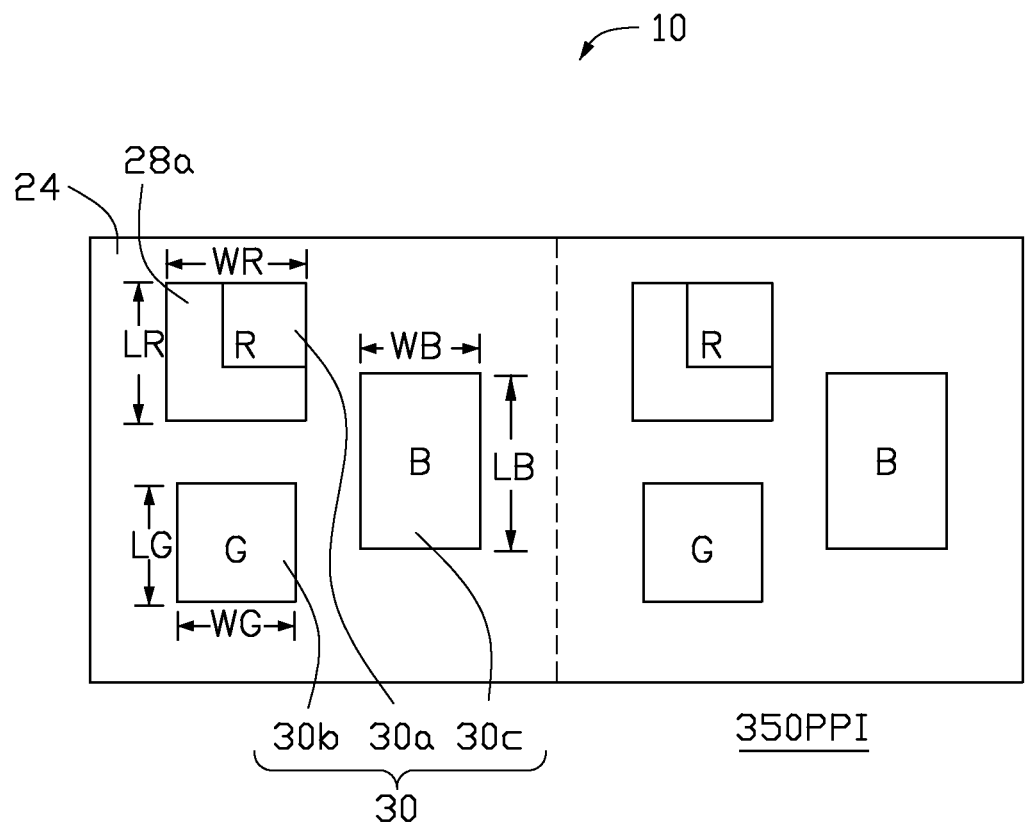
Figure 15:
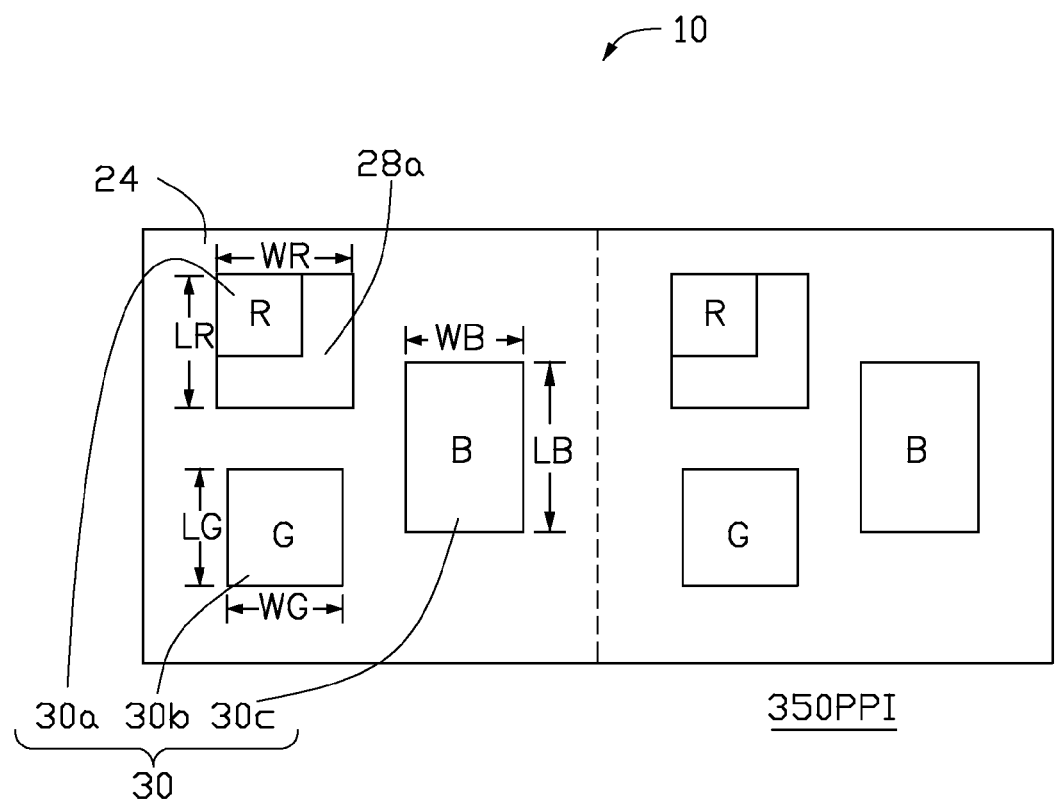
Figure 16:
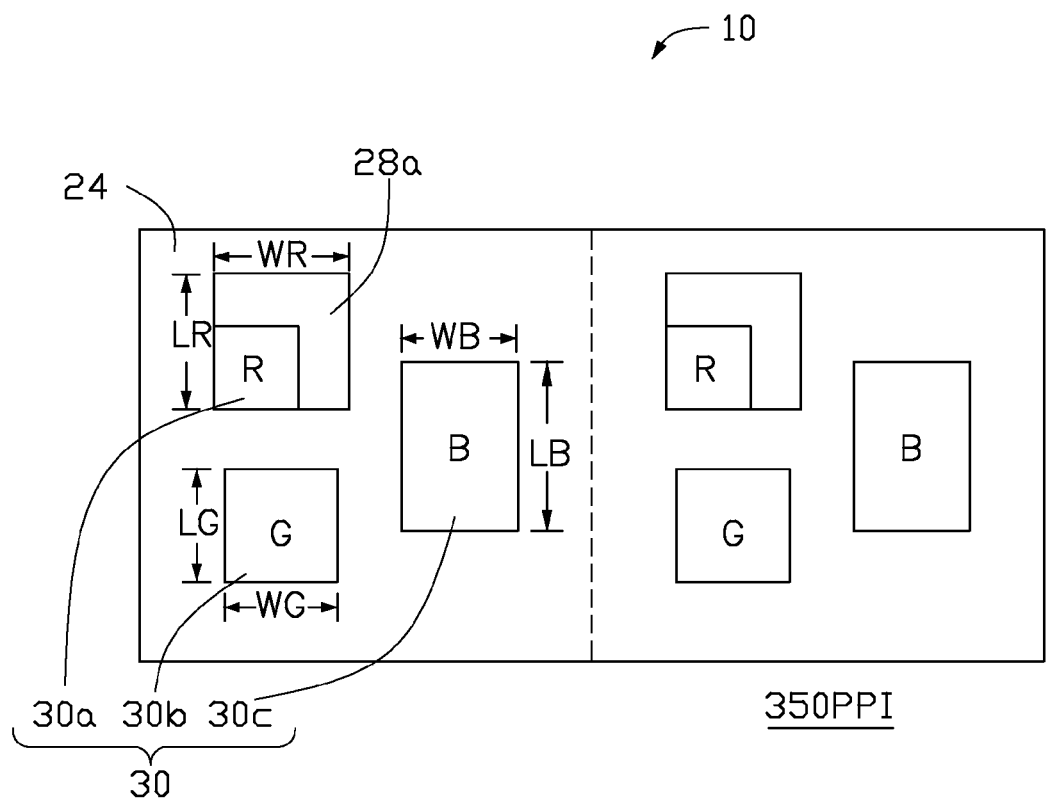
Figure 17:
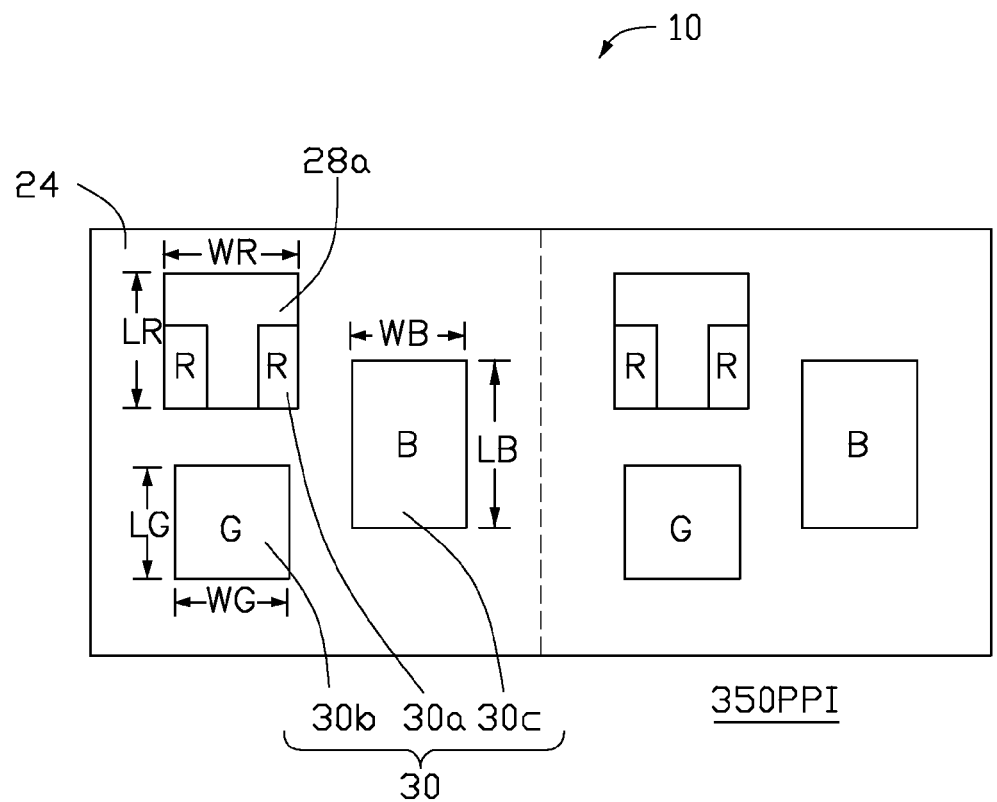

FIG. 12 is a block diagram of a pixel arrangement of a fifth embodiment of an OLED panel according to the present disclosure. For example, the PPI of the OLED panel 10 in the fifth embodiment is 350. Both the length LR and the width WR of the first containing area corresponding to the first sub-pixel 30a are 25.6 µm. Both the length LG and the width WG of the second containing area corresponding to the second sub-pixel 30b are 21.7 µm. The length LB of the third containing area corresponding to the third sub-pixel 30c is 32 µm and the width WB of the third containing area corresponding to the third sub-pixel 30b is 22 µm. In the fifth embodiment, the first partition 28a includes a first portion parallel to one of the walls of the first containing area extending in a first direction, and a second portion parallel to one of the walls of the first containing area extending in a second direction. The first direction is parallel to the direction of the length LR of the first containing area, and the second direction is parallel to the direction of the width WR of the first containing area. Both the width of the first portion and the second portion are 10 µm. Therefore, the emitting area of the first sub-pixel 30a is 244 µm2, and the first containing area corresponding to the first sub-pixel 30a is 655 µm2. Such that the droplet is deposited inside the first containing area to avoid the color mixing issue. Furthermore, please refer to FIGS. 13, 14, 15, 16 and 17, the first partition 28a includes a first portion parallel to one of the walls of the first containing area extending in the first direction, and a second portion parallel to one of the walls of the first containing area extending in the second direction. The shape of the first partition 28a is a L type or a T type, and both the width of the first portion and the second portion of the first partition 28a are 10 µm.

Figure 18:
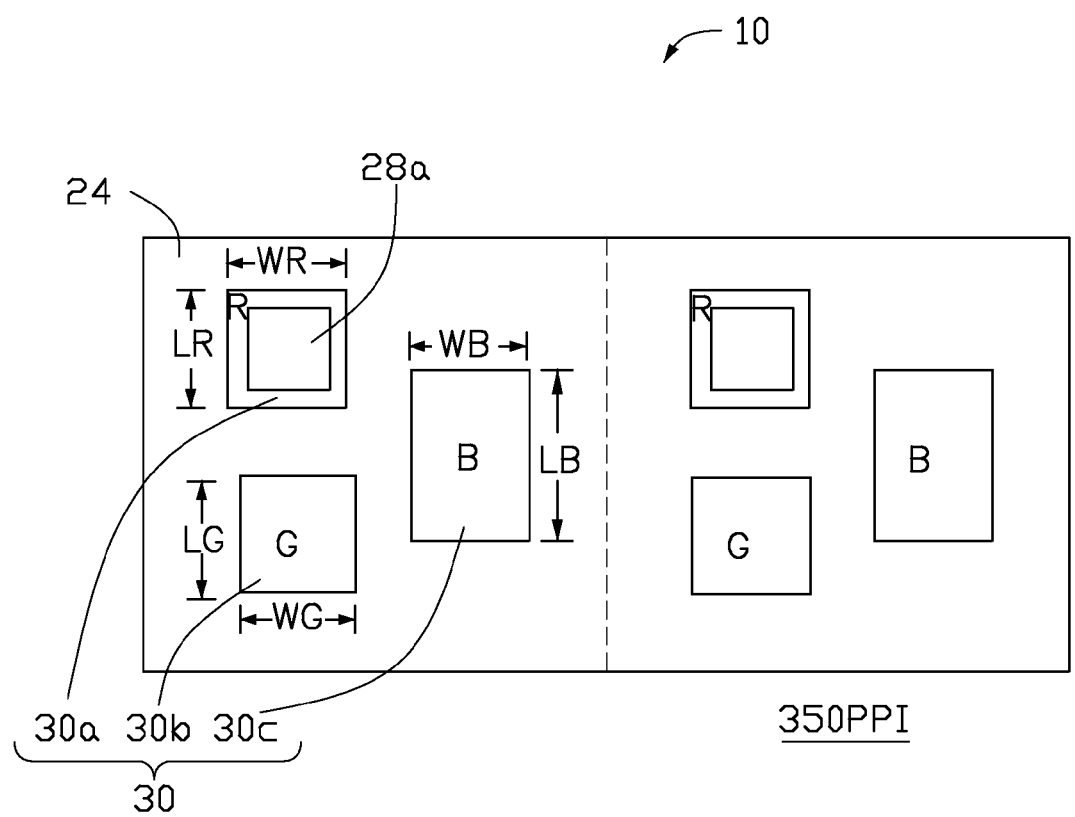
FIG. 18 is a block diagram of a pixel arrangement of a sixth embodiment of an OLED panel according to the present disclosure.

FIG. 18 is a block diagram of a pixel arrangement of a sixth embodiment of an OLED panel according to the present disclosure. For example, the PPI of the OLED panel 10 in the sixth embodiment is 350. Both the length LR and the width WR of the first containing area corresponding to the first sub-pixel 30a are 22 µm. Both the length LG and the width WG of the second containing area corresponding to the second sub-pixel 30b are 21.7 µm. The length LB of the third containing area corresponding to the third sub-pixel 30c is 32 µm and the width WB of the third containing area corresponding to the third sub-pixel 30b is 22 µm. In the sixth embodiment, the shape of the first partition 28a is square, and the position of the first partition 28a is located at the center of the first containing area. Both the length and the width of the first partition 28a are 15.5 µm. Therefore, the emitting area of the first sub-pixel 30a is 244 µm2, and the first containing area corresponding to the first sub-pixel 30a is 484 µm2. Such that the droplet is deposited inside the first containing area to avoid the color mixing issue.

Figure 19:
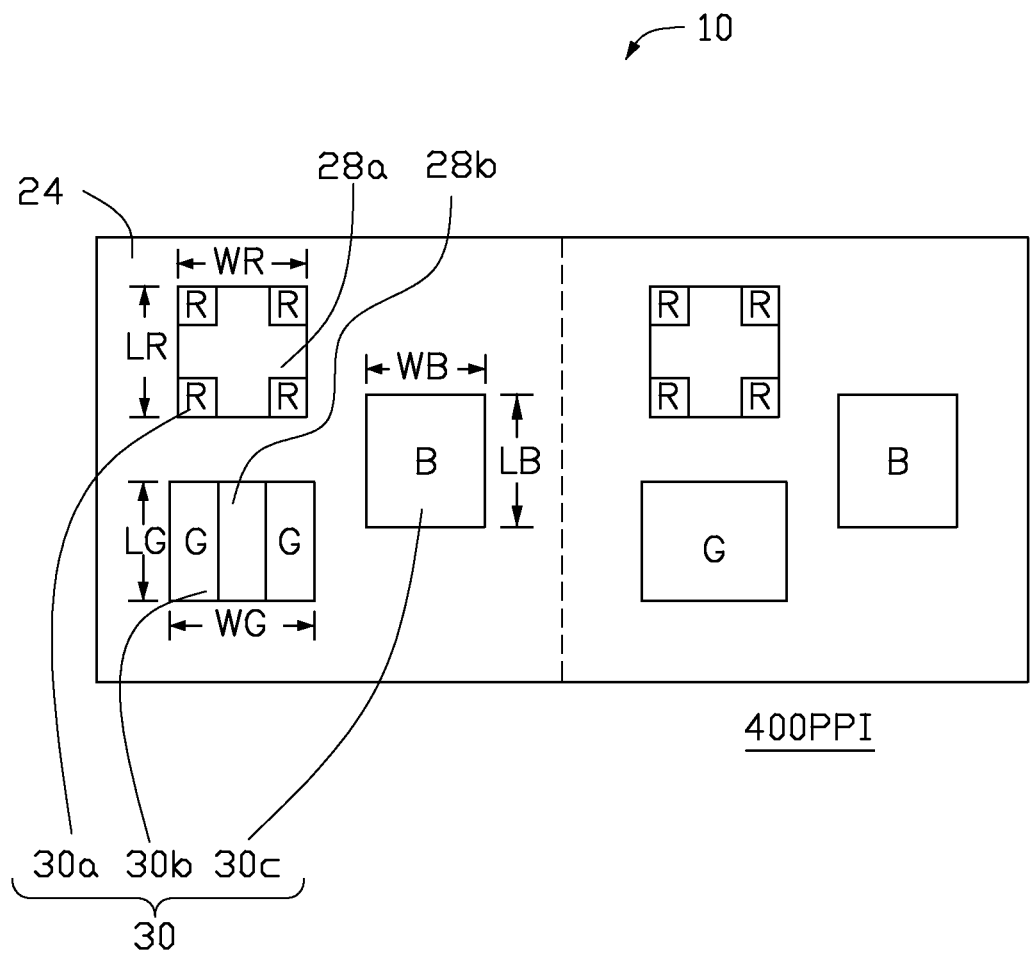
FIG. 19 is a block diagram of a pixel arrangement of a seventh embodiment of an OLED panel according to the present disclosure.

FIG. 19 is a block diagram of a pixel arrangement of a seventh embodiment of an OLED panel according to the present disclosure. For example, the PPI of the OLED panel 10 in the seventh embodiment is 400. When the PPI of the OLED panel 10 is 400, the shortest edge of the first containing area corresponding to the first sub-pixel 30a is smaller than the diameter of the droplet of the emitting material 32 emitting red color, and the shortest edge of the second containing area corresponding to the second sub-pixel 30b is smaller than the diameter of the droplet of the emitting material 32 emitting green color. Such that the droplet of the emitting material 32 emitting red color cannot be totally injected into the first containing area, and the droplet of the emitting material 32 emitting green color cannot be totally injected into the second containing area. It causes the droplets to be deposited outside the first containing area and the second containing area, and the color mixing issue of the OLED panel 10. The first containing area is enlarged such that the droplet of the emitting material 32 emitting red color is totally injected into the first containing area. The second containing area is enlarged such that the droplet of the emitting material 32 emitting green color is totally injected into the second containing area. The shortest edge of the first containing area is enlarged to over the diameter of the droplet of the emitting material 32 emitting red color. The shortest edge of the second containing area is enlarged to over the diameter of the droplet of the emitting material 32 emitting green color. The first partition 28a is formed in the first containing area and the height of the first partition 28a is lower than the walls 24 of the first containing area 26. A second partition 28b is formed in the second containing area and the height of the second partition 28b is lower than the walls 24 of the second containing area. When the droplet of the emitting material 32 emitting green color is injected into the second containing area, the droplet of the emitting material 32 emitting green color flows into, and is formed in a space defined by the second partition 28a and the walls 24 of the second containing area. Such that the area of the second partition 28b balances the enlarged area of the second containing area, and the emitting area of the second sub-pixel 30b is kept the same.

In the seventh embodiment, both the length LR and the width WR of the first containing area corresponding to the first sub-pixel 30a are 23.7 µm. The length LG of the second containing area corresponding to the second sub-pixel 30b is 22 µm, and the width WG of the second containing area corresponding to the second sub-pixel 30b is 26.6 µm. The length LB of the third containing area corresponding to the third sub-pixel 30c is 24.5 µm, and the width WB of the third containing area corresponding to the third sub-pixel 30b is 22 µm. In the seventh embodiment, the first partition 28a includes a first portion parallel to one of the walls of the first containing area extending in a first direction, and a second portion parallel to one of the walls of the first containing area extending in a second direction. The first direction is parallel to the direction of the length LR of the first containing area, and the second direction is parallel to the direction of the width WR of the first containing area. Both the width of the first portion and the second portion are 10 µm. The second partition 28b is parallel to one of the walls 24 of the second containing area extending in a first direction. The first direction is parallel to the direction of the length LG of the second containing area. Both ends of the second partition 28b contact with one of the walls 24 of the second containing area extending in a second direction different from the first direction. The second direction is parallel to the direction of the width WG of the second containing area. The position of the second partition 28b is located at the center of the second containing area corresponding to the second sub-pixel 30b. The width of the second partition 28a is 10

μm. Therefore, the emitting area of the first sub-pixel 30a is 187 μm2, and the first containing area corresponding to the first sub-pixel 30a is 561 μm2. The emitting area of the second sub-pixel 30b is 364 μm2, and the second containing area corresponding to the second sub-pixel 30b is 585.2 μm2. Such that the droplet is deposited inside the first containing area and the second containing area to avoid the color mixing issue.

Figure 20:
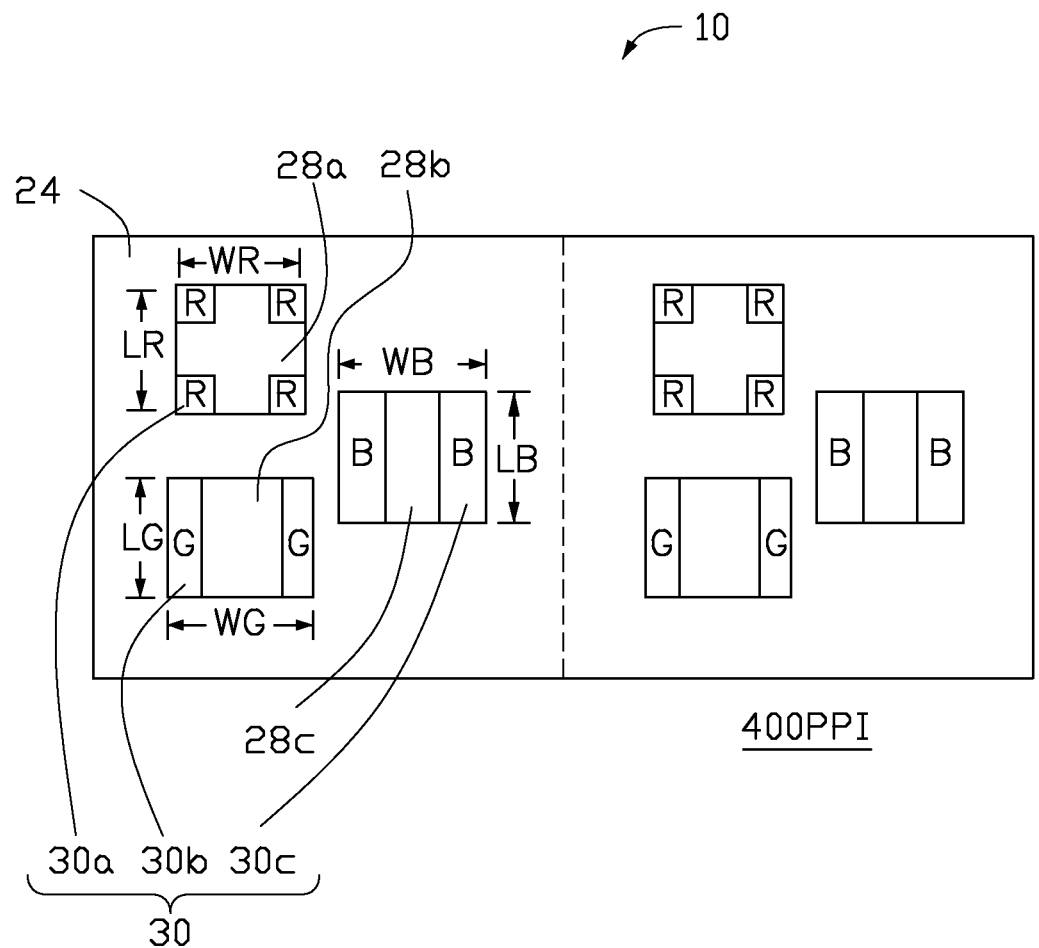
FIG. 20 is a block diagram of a pixel arrangement of an eighth embodiment of an OLED panel according to the present disclosure.

FIG. 20 is a block diagram of a pixel arrangement of a eighth embodiment of an OLED panel according to the present disclosure. When the shortest edge of the third containing area corresponding to the third sub-pixel 30c is also smaller than the diameter of the droplet of the emitting material 32 emitting blue color, the droplet of the emitting material 32 emitting blue color cannot be totally injected into the third containing area. It also causes the droplet to be deposited outside the third containing area, and the color mixing issue of the OLED panel 10. The third containing area is also enlarged such that the droplet of the emitting material 32 emitting blue color is totally injected into the third containing area. The shortest edge of the third containing area is enlarged to over the diameter of the droplet of the emitting material 32 emitting blue color. A third partition 28c is formed in the third containing area and the height of the third partition 28c is lower than the walls 24 of the third containing area. When the droplet of the emitting material 32 emitting blue color is injected into the third containing area, the droplet of the emitting material 32 emitting blue color flows into, and is formed in a space defined by the third partition 28c and the walls of the third containing area. Such that the area of the third partition 28c balances the enlarged area of the third containing area, and the emitting area of the third sub-pixel 30c is kept the same.

An emitting area of a sub-pixel of an OLED panel 10 is kept the same when a containing area corresponding to the sub-pixel is enlarged by forming a partition in the containing area. Such that an OLED panel 10 with high resolution is obtained.

The embodiments shown and described above are only examples. Many details are often found in the art such as the other features of a OLED panel. Therefore, many such details are neither shown nor described. Even though numerous characteristics and advantages of the present technology have been set forth in the foregoing description, together with details of the structure and function of the present disclosure, the disclosure is illustrative only, and changes can be made in the detail, especially in matters of shape, size and arrangement of the parts within the principles of the present disclosure up to, and including the full extent established by the broad general meaning of the terms used in the claims. It will therefore be appreciated that the embodiments described above can be modified within the scope of the claims.

While the above description has been by way of examples and in terms of preferred embodiments, it is to be understood that the invention is not limited thereto. To the contrary, the above description is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An OLED panel, comprising:
a substrate;
a plurality of walls, the plurality of walls formed on the substrate;
a plurality of sub-pixels, the plurality of sub-pixels separated from each other by the plurality of walls, wherein the substrate and the plurality of walls define a plurality of containing areas, and each of the containing areas corresponds to one of the sub-pixels;
an emitting material formed in a first containing area corresponding to a first sub-pixel; and
a first partition, the first partition formed in the first containing area of the first sub-pixel, wherein height of the first partition is lower than height of the walls of the first containing area; the first partition is formed in the first sub-pixel.

2. The OLED panel of claim 1, wherein the emitting material is formed in a space defined by the first partition and the walls of the first containing area, and the thickness of the emitting material is less than the height of the first partition.

3. The OLED panel of claim 1, wherein the plurality of sub-pixels defines a plurality of pixels, each of the plurality of pixels comprises at least a first sub-pixel, a second sub-pixel, and a third sub-pixel, wherein a first emitting area of the first sub-pixel is larger than a second emitting area of the second sub-pixel, and the second emitting area of the second sub-pixel is larger than a third emitting area of the third sub-pixel.

4. The OLED panel of claim 3, wherein a second partition is formed in the second containing area corresponding to the second sub-pixel, and the height of the second partition is less than the height of the walls of the second containing area.

5. The OLED panel of claim 3, wherein a third partition is formed in the third containing area corresponding to the third sub-pixel, and the height of the third partition is less than the height of the walls of the third containing area.

6. The OLED panel of claim 3, wherein the first sub-pixel is a red sub-pixel, the second sub-pixel is a green sub-pixel, and the third sub-pixel is a blue sub-pixel.

7. The OLED panel of claim 1, wherein the first partition is parallel to one of the walls of the first containing area extending in a first direction, and both ends of the first partition contact the walls of the first containing area extending in a second direction different from the first direction.

8. The OLED panel of claim 7, wherein the position of the first partition is located at the center of the first containing area.

9. The OLED panel of claim 7, wherein the position of the first partition is close to one of the walls of the first containing area extending in the first direction.

10. The OLED panel of claim 1, wherein the shape of the first partition is square.

11. The OLED panel of claim 10, wherein the position of the first partition is located at the center of the first containing area.

12. The OLED panel of claim 1, wherein the first partition includes a first portion parallel to a first direction and a second portion parallel to a second direction.

13. The OLED panel of claim 12, wherein the first portion is parallel to one of the walls of the first containing area extending in the first direction, and the second portion is parallel to one of the walls of the first containing area extending in the second direction.

14. The OLED panel of claim 13, wherein both ends of the first portion contact the walls of the first containing area extending in the second direction, and both ends of the second portion contact the walls of the first containing area extending in the first direction.

15. An organic light emitting diode panel comprising: a plurality of pixels, each pixel comprising:
- a substrate with a plurality of containing areas defined in the substrate, with a first containing area having a first depth and corresponding to a first sub-pixel; and
- a plurality of emitting material, wherein each one of the plurality of emitting material is formed in one of the plurality of containing areas;
- wherein the first containing area includes a first partition, the first partition is formed in the first sub-pixel and has a height less than the first depth.

16. The organic light emitting diode panel of claim 15, wherein the thickness of the emitting material formed in the first containing area is less than the height of the first partition.

17. The organic light emitting diode panel of claim 15, wherein the thickness of the emitting material formed in the first containing area is greater than the height of the first partition.

18. The organic light emitting diode panel of claim 15, wherein each pixel further comprises a second containing area and a third containing area, the first containing area is larger than the second containing area, and the second containing area is larger than the third containing area.

19. The organic light emitting diode panel of claim 15, wherein the shape of the first partition is square.

20. The organic light emitting diode panel of claim 15, wherein the first partition includes a first portion parallel to a first direction and a second portion parallel to a second direction.

* * * * *